United States Patent
Wu

(10) Patent No.: US 11,223,029 B2
(45) Date of Patent: Jan. 11, 2022

(54) DISPLAY DEVICE HAVING GROOVES DISPOSED ON A SURFACE OF RETAINING WALL

(71) Applicant: Wuhan China Star Optoelectronics Semiconductor Display Technology Co., LTD., Hubei (CN)

(72) Inventor: Shaojing Wu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 214 days.

(21) Appl. No.: 16/622,041

(22) PCT Filed: Oct. 18, 2019

(86) PCT No.: PCT/CN2019/111956
§ 371 (c)(1),
(2) Date: Dec. 12, 2019

(87) PCT Pub. No.: WO2021/056639
PCT Pub. Date: Apr. 1, 2021

(65) Prior Publication Data
US 2021/0359264 A1    Nov. 18, 2021

(30) Foreign Application Priority Data
Sep. 24, 2019    (CN) .......................... 201910903502.8

(51) Int. Cl.
*H01L 27/32*    (2006.01)
*H01L 51/52*    (2006.01)

(52) U.S. Cl.
CPC ...... *H01L 51/5253* (2013.01); *H01L 27/3244* (2013.01)

(58) Field of Classification Search
CPC ..... H01L 23/04; H01L 23/10; H01L 27/3244; H01L 27/3246
See application file for complete search history.

(56) References Cited

U.S. PATENT DOCUMENTS

2020/0127068 A1* 4/2020 Wang ...................... H01L 51/56

FOREIGN PATENT DOCUMENTS

| CN | 101726913 A | 6/2010 |
|---|---|---|
| CN | 206976349 U | 2/2018 |
| CN | 108258145 A | 7/2018 |
| CN | 108832016 A | 11/2018 |
| CN | 208127245 U | 11/2018 |
| CN | 108962033 A | 12/2018 |
| CN | 109494242 A | 3/2019 |
| CN | 110212110 A | 9/2019 |

\* cited by examiner

*Primary Examiner* — Hoai V Pham
(74) *Attorney, Agent, or Firm* — Benesch, Friedlander, Coplan & Aronoff LLP

(57) ABSTRACT

The present application provides a display panel and a display device, wherein the display panel includes: a substrate; a retaining wall disposed on the substrate; and an encapsulating film disposed on the retaining wall and covering the substrate, wherein a plurality of grooves are further disposed on a surface of the retaining wall facing the encapsulating film, and the encapsulating film extends into the grooves.

19 Claims, 6 Drawing Sheets

DISPLAY DEVICE HAVING GROOVES DISPOSED ON A SURFACE OF RETAINING WALL

BACKGROUND OF INVENTION

Field of Invention

The present application relates to a field of display technologies, and in particular, to a display panel and a display device.

Description of Prior Art

As a current-type light-emitting device, an organic light-emitting diode (OLED) has received wide attention because of its self-illumination, rich colors, fast response time, wide viewing angles, light weight, and applications on flexible display.

However, an OLED display panel is prone to a delamination problem of an encapsulation layer and its underlying layers during a bending process, resulting in failure of the OLED display panel, thereby reducing product yield.

SUMMARY OF INVENTION

The technical problem mainly solved by the present application is how to improve the reliability of the OLED panel package and thereby improve the service life of the OLED device.

In a first aspect, the present application provides a display panel, including:
a substrate;
a retaining wall disposed on the substrate; and
an encapsulation film disposed on the retaining wall and covering the substrate,
wherein a plurality of grooves are further disposed on a surface of the retaining wall facing the encapsulating film, and the encapsulating film extends into the plurality of grooves;
the encapsulating film includes a first inorganic layer, an organic layer, and a second inorganic layer disposed on the substrate in sequence;
the retaining wall is disposed on an edge region of the first inorganic layer, the organic layer is disposed on the first inorganic layer and retained within the retaining wall, the second inorganic layer is disposed on the organic layer and covers the first inorganic layer, the organic layer, and the retaining wall, and the second inorganic layer extends into the grooves;
each of the grooves is provided with a protrusion, and the protrusion has a height greater than a depth of the grooves.

In the display panel provided by the present application, the plurality of grooves are correspondingly disposed on a bending region of the substrate.

In the display panel provided by the present application, the substrate includes opposite first and second ends; and
the retaining wall is disposed on the first end and the second end, and a direction of the first end to the second end is perpendicular to a bending direction of the substrate.

In the display panel provided by the present application, the plurality of the grooves are arranged in an array.

In the display panel provided by the present application, the retaining wall includes a first sub-retaining wall and a second sub-retaining wall spaced apart from each other, and the plurality of grooves include a plurality of first sub-grooves and a plurality of a second sub-grooves; and
the plurality of the first sub-grooves are spaced apart from each other and disposed on the first sub-retaining wall, and the plurality of the second sub-grooves are spaced apart from each other and disposed on the second sub-retaining wall.

In the display panel provided by the present application, each of the first sub-grooves corresponds to one of the second sub-grooves.

In the display panel provided by the present application, the plurality of the first sub-grooves and the plurality of the second sub-grooves are staggered alternately from each other; and
each of the second sub-grooves is correspondingly disposed at an interval between its adjacent ones of the first sub-grooves.

In the display panel provided by the present application, a distance between the adjacent ones of the first sub-grooves is equal to a distance between adjacent ones of the second sub-grooves.

In a second aspect, the present application provides a display panel, including:
a substrate;
a retaining wall disposed on the substrate; and
an encapsulation film disposed on the retaining wall and covering the substrate;
wherein a plurality of grooves further disposed on a surface of the retaining wall facing the encapsulating film, and the encapsulating film extends into the plurality of grooves.

In the display panel provided by the present application, the encapsulating film includes a first inorganic layer, an organic layer, and a second inorganic layer disposed on the substrate in sequence; and
wherein the retaining wall is disposed on an edge region of the first inorganic layer, the organic layer is disposed on the first inorganic layer and retained within the retaining wall, the second inorganic layer is disposed on the organic layer and covers the first inorganic layer, the organic layer, and the retaining wall, and the second inorganic layer extends into the grooves.

In the display panel provided by the present application, the plurality of grooves are correspondingly disposed on a bending region of the substrate.

In the display panel provided by the present application, the substrate includes opposite first and second ends;
the retaining wall is disposed on the first end and the second end, and a direction of the first end to the second end is perpendicular to a bending direction of the substrate.

In the display panel provided by the present application, the plurality of the grooves are arranged in an array.

In the display panel provided by the present application, the retaining wall includes a first sub-retaining wall and a second sub-retaining wall spaced apart from each other, and the plurality of grooves include a plurality of first sub-grooves and a plurality of a second sub-grooves; and
the plurality of the first sub-grooves are spaced apart from each other and disposed on the first sub-retaining wall, and the plurality of the second sub-grooves are spaced apart from each other and disposed on the second sub-retaining wall.

In the display panel provided by the present application, each of the first sub-grooves corresponds to one of the second sub-grooves.

In the display panel provided by the present application, the plurality of the first sub-grooves and the plurality of the second sub-grooves are staggered alternately from each other; and each of the second sub-grooves is correspondingly disposed at an interval between its adjacent ones of the first sub-grooves.

In the display panel provided by the present application, a distance between the adjacent ones of the first sub-grooves is equal to a distance between adjacent ones of the second sub-grooves.

In the display panel provided by the present application, each of the grooves is provided with a protrusion, and the protrusion has a height greater than a depth of the grooves.

In a third aspect, the present application provides a display device, including a display panel, the display panel including:

a substrate;

a retaining wall disposed on the substrate; and an encapsulation film disposed on the retaining wall and covering the substrate, wherein a plurality of grooves are further disposed on a surface of the retaining wall facing the encapsulating film, and the encapsulating film extends into the plurality of grooves.

Beneficial effects of the present application are that: by providing a plurality of grooves on the retaining wall, a contact area between the encapsulating film and the retaining wall is increased, and the reliability of the OLED panel package is improved, thereby elongating the service life of the OLED device.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 8 is a schematic structural diagram of a touch unit according to an embodiment of the present disclosure.

DETAILED DESCRIPTION OF PREFERRED EMBODIMENTS

With reference to the appended drawings, exemplary embodiments of the present invention will be described in detail below. To aid in understanding the present invention, like numbers refer to like elements throughout the description of the figures, and the description of the same elements will be not reiterated. For illustration clarity, many details of practice are explained in the following descriptions. However, it should be understood that these details of practice do not intend to limit the present disclosure.

Figure 1:
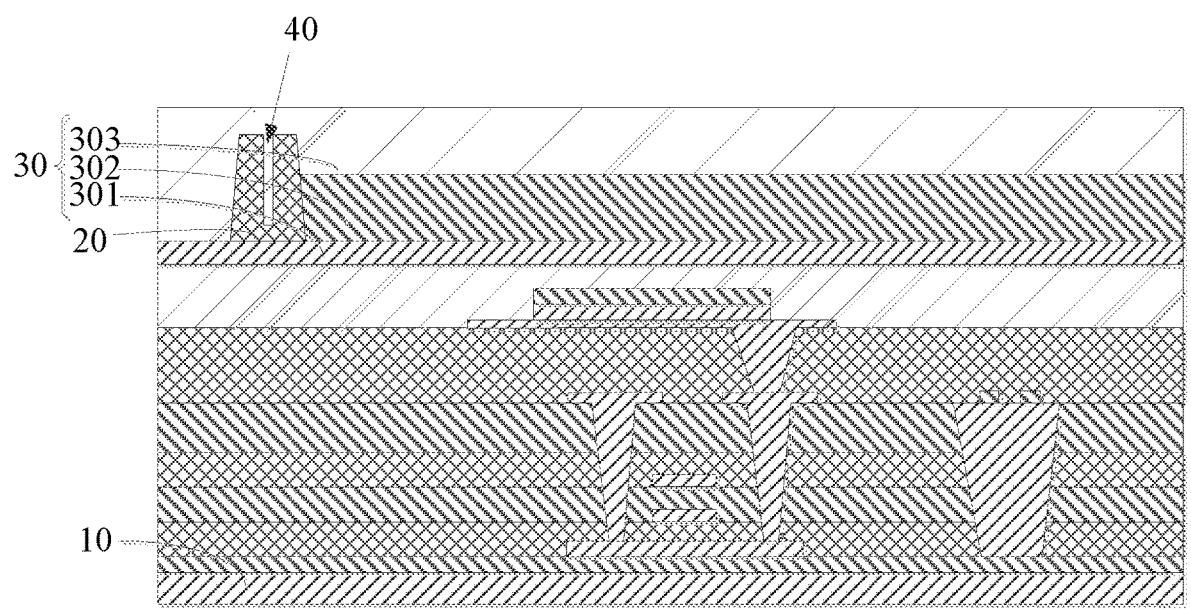
FIG. 1 is a schematic structural view of a display panel provided by a first embodiment of the present application.

Please refer to FIG. 1. FIG. 1 is a schematic structural diagram of a display panel provided by a first embodiment of the present application.

The present application provides a display panel 1 including a substrate 10, a retaining wall 20, and an encapsulating film 30. The retaining wall 20 is disposed on the substrate 10, and the encapsulating film 30 is disposed on the retaining wall 20 and covers the substrate 10. A plurality of grooves 40 are further disposed on a surface of the retaining wall 20 facing the encapsulating film 20, and the encapsulating film 20 extends into the plurality of grooves 40.

For example, the substrate 10 may be a flexible substrate on which a planarization layer, a pixel defining layer, an anode, a light-emitting layer, and a cathode may be formed. The retaining wall 20 is disposed at an edge region of the pixel defining layer 20 for preventing water and oxygen in the outside from invading from a side of the display panel 1, resulting in failure of the light-emitting layer. Material of the retaining wall 20 may be an inorganic material or an organic material, which may be specifically selected according to actual conditions. The encapsulation film 30 is disposed on the retaining wall 20 and covers the substrate 10. In addition, a portion of the encapsulation film 30 extends into the grooves 40 and is disposed along inner walls of the grooves 40.

In some embodiments, the encapsulation film 30 includes a first inorganic layer 301, an organic layer 302, and a second inorganic layer 303 that are sequentially stacked on the substrate 10. The retaining wall 20 is disposed on an edge region of the first inorganic layer 301, the organic layer 302 is disposed on the first inorganic layer 301 and retained within the retaining wall 20, the second inorganic layer 303 is disposed on the organic layer 302 and covers the first inorganic layer 301, the organic layer 302, and the retaining wall, and the second inorganic layer 303 extends into the grooves 40.

By providing the plurality of grooves 40 on the retaining wall 20, a contact area between the encapsulating film 30 and the retaining wall 20 is increased, reliability of package of the display panel 1 is improved, and a service life of the display panel 1 is elongated.

Figure 2:
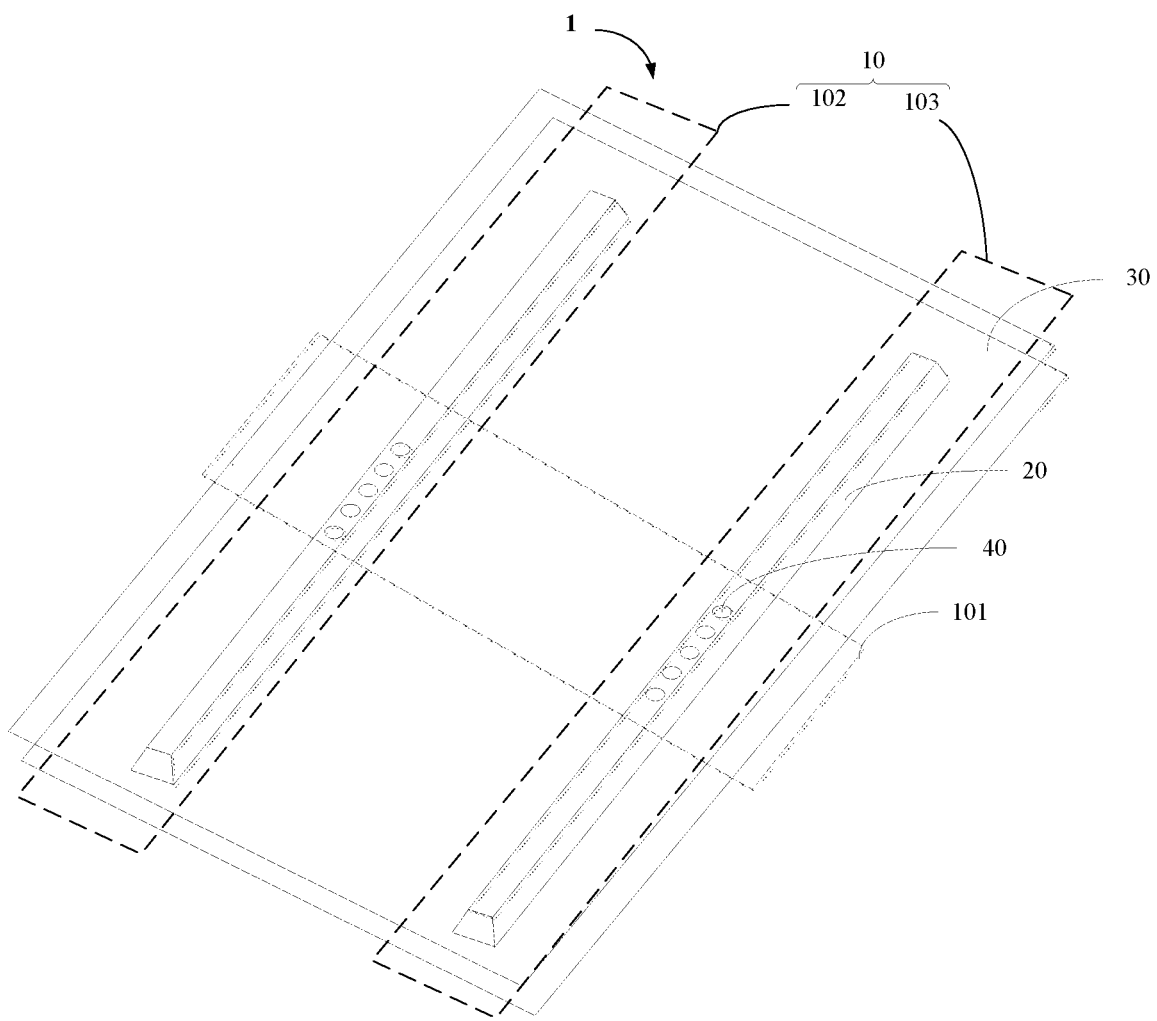
FIG. 2 is a plan view showing a display panel provided by a first embodiment shown in FIG. 1.

In some embodiments, please refer to FIG. 2. FIG. 2 is a schematic plan view of the display panel provided by the first embodiment shown in FIG. 1. The present application also provides a display panel 1. The plurality of grooves 40 are correspondingly disposed on a bending region 101 of a substrate 10.

Further, the substrate 10 includes a first end 102 and a second end 103 that are oppositely disposed. The first end 102 and the second end 103 are each provided with a retaining wall 20, and the direction from the first end 102 to the second end 103 is perpendicular to the bending direction of the substrate 10.

For example, a plurality of grooves 40 may be disposed in a region of the bending region 101 where stress is relatively concentrated. Since a direction from the first end 102 to the second end 103 is perpendicular to a bending direction of the substrate 10, the plurality of grooves 40 not only can increase the contact area between the retaining wall 20 and the encapsulating film 20 to improve the reliability of the packaging of the display panel 1, but also can absorb partial stress during bending to prevent the encapsulating film 20 from breakage during bending, and thus the reliability of package of the display panel 1 is further improved, thereby elongating the service life of the display panel 1.

It should be noted that the present application is only described by taking one retaining wall 20 on both the first end 102 and the second end 103 as an example, but the present application is not particularly limited thereto. Of course, a plurality of retaining walls 20 may also be disposed on the first end 102 and the second end 103, depending on actual situations.

Figure 3:
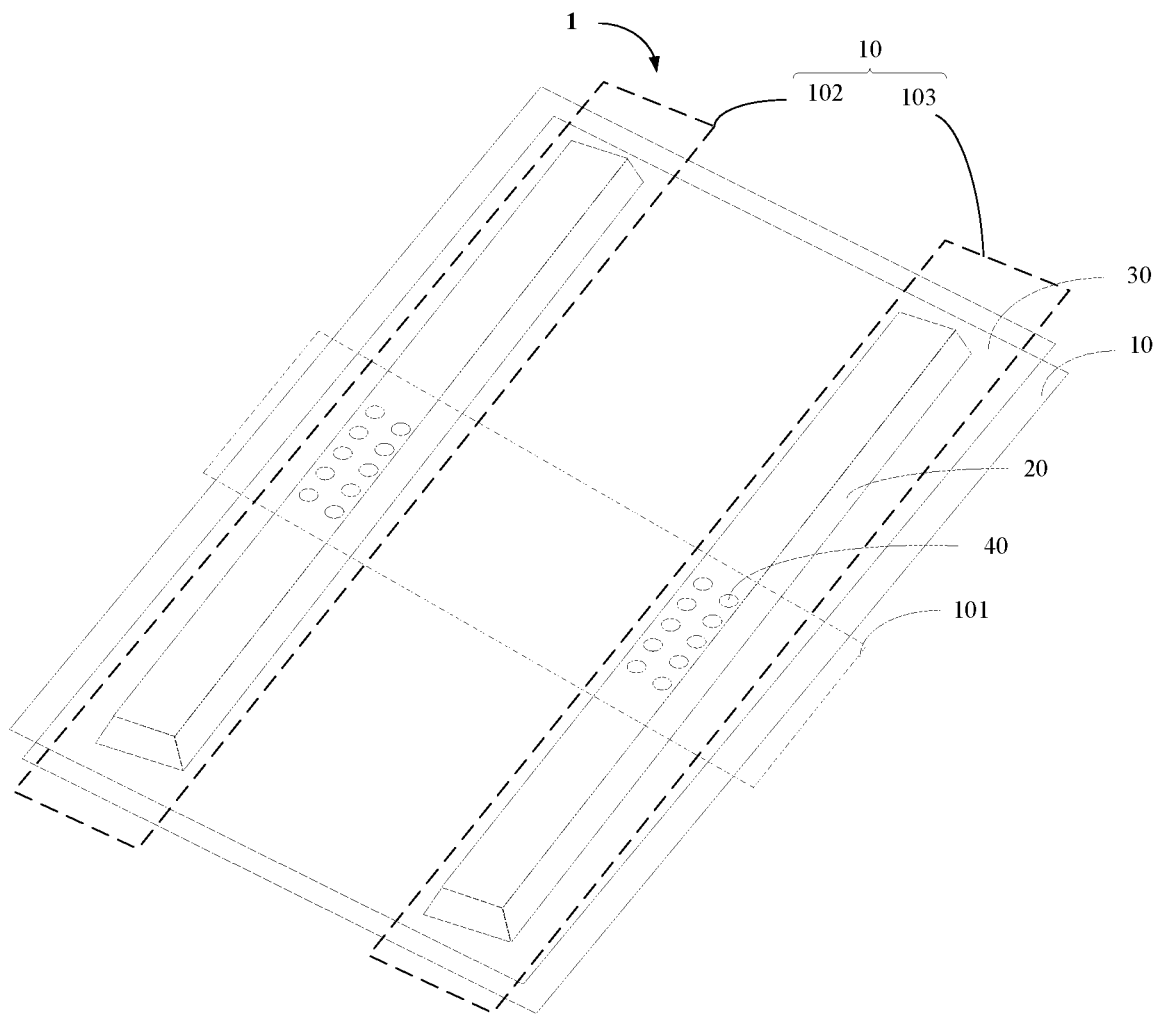
FIG. 3 is a plan view showing a display panel provided by a second embodiment shown in FIG. 1.

In some embodiments, the plurality of grooves 40 are arranged in an array, as shown in FIG. 3.

Figure 4:
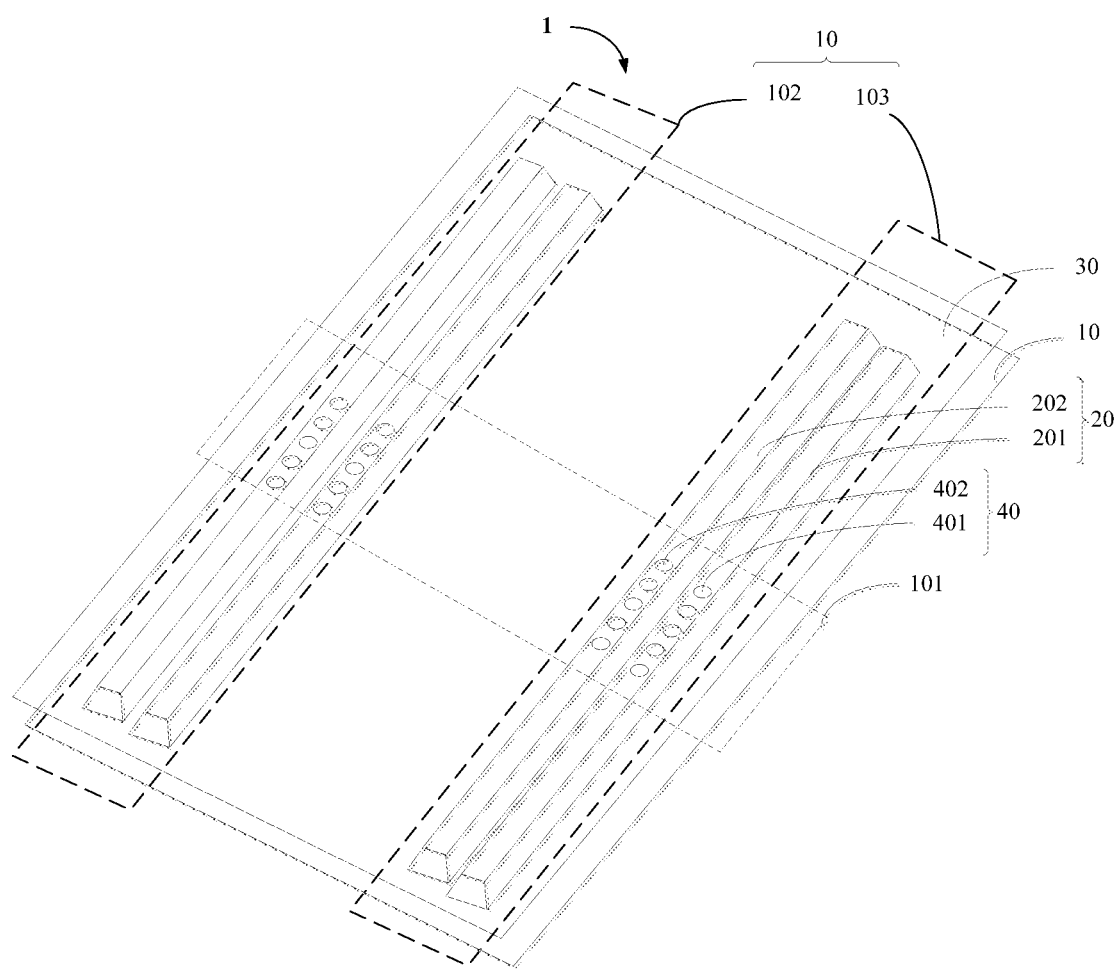
FIG. 4 is a plan view showing a display panel provided by a third embodiment shown in FIG. 1.

In some embodiments, please refer to FIG. 4. FIG. 4 is a schematic plan view of the display panel provided by a third embodiment shown in FIG. 1. The present application also provides a display panel 1. A difference between the display panel 1 of FIG. 3 and the display panel 1 of FIG. 2 is that the retaining wall 20 includes a first sub-retaining wall 201 and a second sub-retaining wall 202 that are spaced apart from each other, and the grooves 40 includes first sub-grooves 401 and second sub-grooves 402. The plurality of first sub-grooves 401 are spaced apart from each other and disposed on the first sub-retaining wall 301, and the plurality of second sub-grooves 402 are spaced apart from each other and disposed on the second sub-retaining wall 302.

For example, in a direction from the edge region to the central region of the substrate 10, the first sub-retaining wall 201 and the second sub-retaining wall 202 are spaced apart and disposed on the first end 102, and the first sub-retaining wall 201 and the second sub-retaining wall 202 are spaced apart and disposed on the second end 103. In actual production, the first sub-retaining wall 201 and the second sub-retaining wall 202 are formed on the first end 102 and the second end 103, respectively. Then, a mask can be used to etch preset positions of the first sub-retaining wall 201 and preset positions of the second sub-retaining wall 202 to form the first sub-grooves 401 on the first sub-retaining wall 201 and form the second sub-grooves 402 on the second sub-retaining wall 202.

By providing the plurality of first sub-grooves 401 on the first sub-retaining wall 201 and the plurality of second sub-grooves 402 on the second sub-retaining wall 202, a contact area between the encapsulating film 30 and the first sub-retaining wall 201 and the second sub-retaining wall 202 is increased to improve the reliability of package of the display panel 1, thereby elongating the service life of the display panel 1.

In addition, it should be noted that the first sub-grooves 401 and the second sub-grooves 402 can be correspondingly disposed on the bending region 101 of the substrate 10, and when the display panel 1 is bent, the first sub-grooves 401 and the second sub-grooves 402 can also absorb part of the stress during bending to prevent the encapsulating film 20 from breakage during bending, thereby further improving the reliability of package of the display panel 1 and further elongating the service life of the display panel 1.

In some embodiments, each of the first sub-grooves 401 corresponds to one of the second sub-grooves 402. That is, the plurality of first sub-grooves 401 are in one-to-one correspondence with the plurality of second sub-grooves 402.

For example, the first sub-grooves 401 are disposed on the first sub-retaining wall 201 by a number of ten, and the second sub-grooves 402 are disposed on the second sub-retaining wall 202 by a number of ten. The first one of the first sub-grooves 401 correspond to the first one of the second sub-grooves 402, and so on.

Each of the first sub-grooves 401 corresponds to one of the second sub-grooves 402, which further increases the contact area between the encapsulating film 30 and the first sub-retaining wall 201 and the second sub-retaining wall 202, thereby improving the reliability of package of the display panel 1, and further increasing the service life of the display panel 1. In addition, when the display panel 1 is bent, the first sub-grooves 401 and the second sub-grooves 402 located on the bending region 101 of the substrate 10 can also absorb part of the stress during bending, and, since each of the first sub-grooves 401 corresponds to one of the second sub-grooves 402, and the first sub-retaining wall 201 or the second sub-retaining wall 202 is prevented from breakage due to uneven stress, which further improves the reliability of package of the display panel 1.

Figure 5:
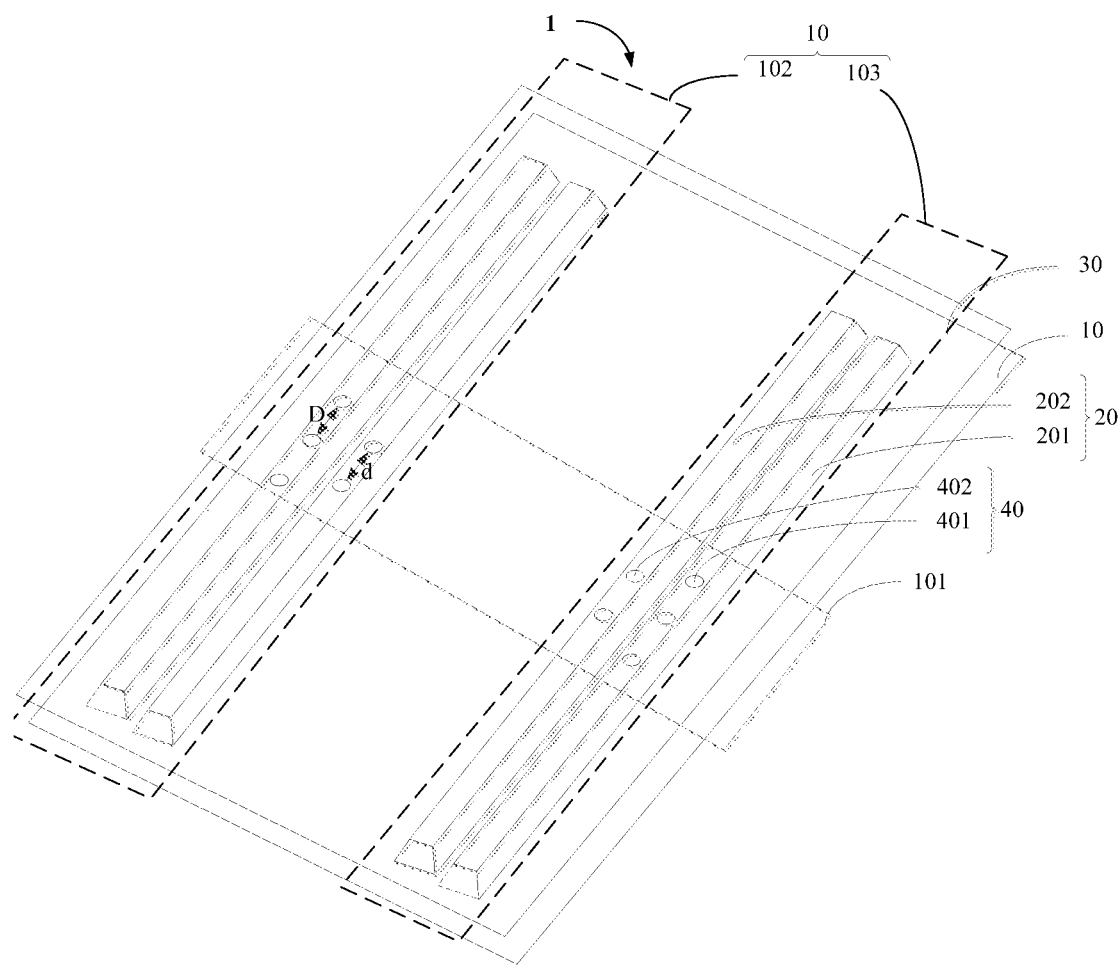
FIG. 5 is a plan view showing a display panel provided by a fourth embodiment shown in FIG. 1.

In some embodiments, please refer to FIG. 5. FIG. 5 is a schematic plan view of the display panel provided by a fourth embodiment shown in FIG. 1. The present application also provides a display panel 1. A difference between the display panel 1 of FIG. 4 and the display panel 1 of FIG. 2 is that the plurality of first sub-grooves 401 and the plurality of second sub-grooves 402 are staggered alternately from each other; and each of the second sub-grooves 402 is correspondingly disposed at an interval between its adjacent ones of the first sub-grooves 401.

For example, the first sub-grooves 401 are spaced apart from each other and disposed on the first sub-retaining wall 201 by a number of ten, and there is an interval between adjacent ones of the first sub-grooves 401, that is, there are nine intervals. Each of the second sub-grooves 402 is disposed at an interval of the adjacent ones of the first sub-grooves 401, that is, the second sub-grooves 402 are respectively disposed at the intervals of the adjacent first sub-grooves 401 by a number of nine.

The plurality of first sub-grooves 401 are disposed on the first sub-retaining wall 201, and the plurality of second sub-grooves 402 are disposed on the second sub-retaining wall 202 to enlarge the contact area between the encapsulation film 30 and the first sub-retaining wall 201 and the second sub-retaining walls 202, thus improving the reliability of package of the display panel 1, and thereby elongating the service life of the display panel 1. In addition, the plurality of first sub-grooves 401 and the plurality of second sub-grooves 402 are staggered alternately from each other, and when the display panel 1 is bent, the first sub-grooves 401 and the second sub-grooves 402 located on the bending region 101 of the substrate 10 can absorb the stress at each of the bending regions 101 to prevent the first sub-retaining wall 201 or the second sub-retaining wall 202 from breakage caused by uneven stress, thereby further improving the reliability of package of the display panel 1.

In some embodiments, a distance D between adjacent ones of the first sub-grooves 401 is equal to a distance d between adjacent ones of the second sub-grooves 402.

Figure 6:
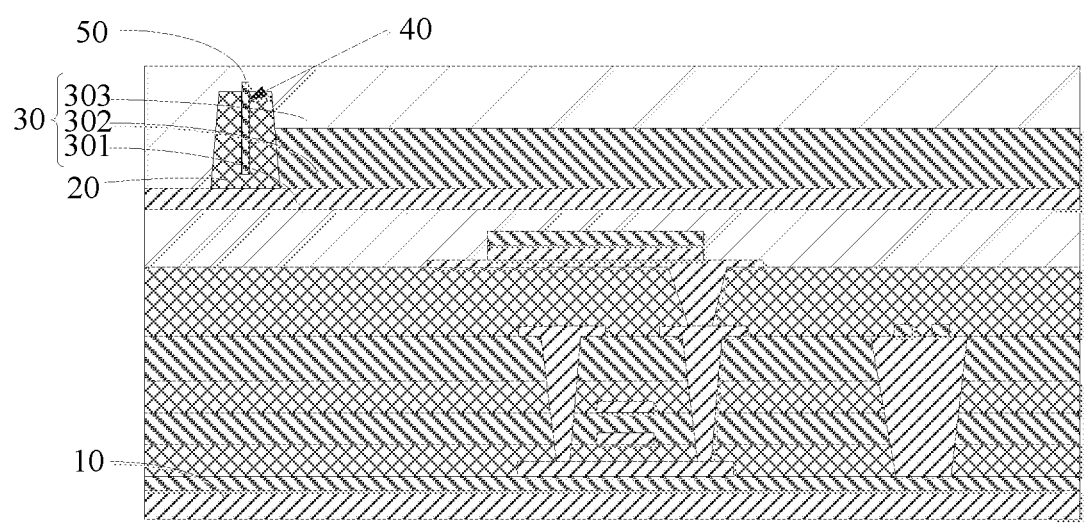
FIG. 6 is a schematic structural diagram of a display panel provided by a second embodiment of the present application.

In some embodiments, please refer to FIG. 6. FIG. 6 is a schematic structural diagram of a display panel provided by a second embodiment of the present application. The present application also provides a display panel 1. A difference between the display panel 1 of FIG. 6 and the display panel 1 of FIG. 1 is that each of the grooves 40 is provided with a protrusion 50, wherein a height H of the protrusion 50 is greater than a depth h of the grooves 40.

For example, each of the grooves 40 is provided with a protrusion 50, and a width S of each of the grooves 40 is larger than a width s of its corresponding protrusion 50. Specifically, the plurality of grooves 40 are formed in the retaining wall 20 by one mask process. Then, one protrusion 50 can be formed in each of the grooves 40 using an inkjet printing process.

Figure 7:
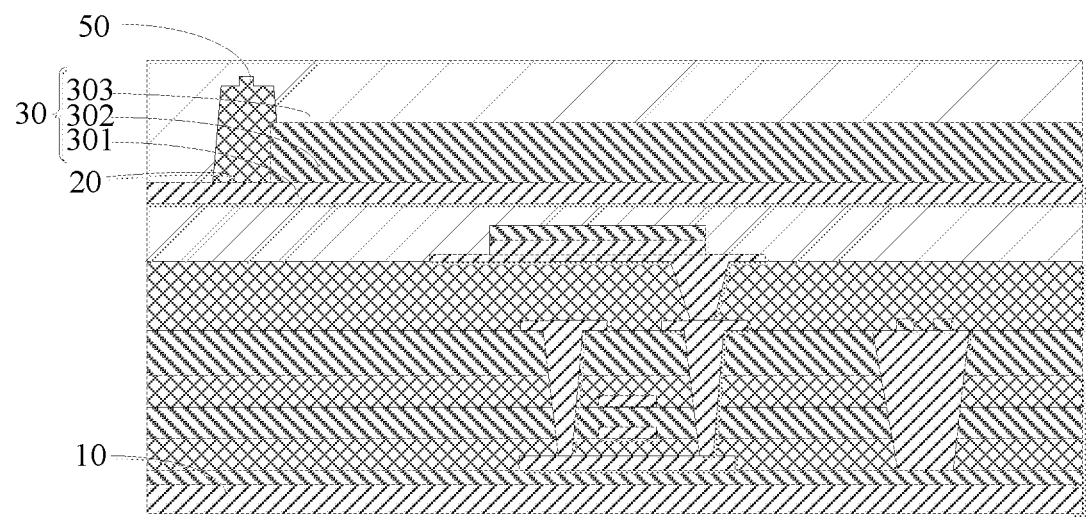
FIG. 7 is a schematic structural view of a display panel provided by a third embodiment of the present application.
Figure 8:
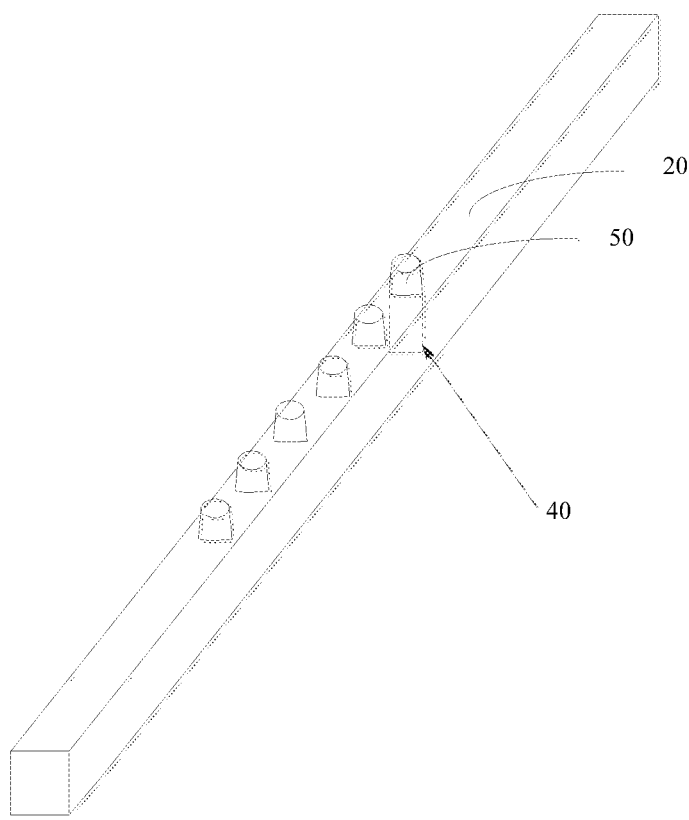
FIG. 8 is a schematic structural view of one retaining wall in the display panel shown in FIG. 7.

In some embodiments, please refer to FIG. 7 and FIG. 8. FIG. 7 is a schematic structural diagram of a display panel provided by a third embodiment of the present application, and FIG. 8 is a schematic structural diagram of a single retaining wall of the display panel shown in FIG. 7. The retaining wall 20 with the grooves 40 and the projections 50 can be formed by one mask process, and each of the grooves 40 is adapted to its corresponding one of the projections 50 of the grooves 40, that is, a width S of each of the grooves 40 is equal to a width 40 of its corresponding protrusion 50.

By providing a protrusion 50 in each of the grooves 40, and the height H of the protrusions 50 being greater than the depth h of the grooves 40, the contact area between the encapsulating film 30 and the retaining wall 20 is increased, and the reliability of the package of the display panel 1 is improved, thereby elongating the service life of the display panel 1.

The present application further provides a display device, including the display panel 1 provided by any one of the embodiments of the present application. Details mat be referred to the previous embodiments, and are not repeated herein for brevity.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising:
a substrate;
at least one retaining wall disposed on the substrate; and
an encapsulation film disposed on the retaining wall and covering the substrate;
wherein a plurality of grooves are further disposed on a surface of the retaining wall facing the encapsulating film, and the encapsulating film is extended into the plurality of grooves;
wherein the encapsulating film comprises a first inorganic layer, an organic layer, and a second inorganic layer disposed on the substrate in sequence;
wherein the retaining wall is disposed on an edge region of the first inorganic layer, the organic layer is disposed on the first inorganic layer and retained within the retaining wall, the second inorganic layer is disposed on the organic layer and covering the first inorganic layer, the organic layer, and the retaining wall, and the second inorganic layer is extended into the grooves; and
wherein each of the grooves is provided with a protrusion, and the protrusion has a height greater than a depth of the grooves.

2. The display panel according to claim 1, wherein the plurality of grooves are correspondingly disposed on a bending region of the substrate.

3. The display panel according to claim 2, wherein the substrate comprises opposite first and second ends; and
the retaining walls are disposed on the first end and the second end, and a direction from the first end to the second end is perpendicular to a bending direction of the substrate.

4. The display panel according to claim 3, wherein the plurality of the grooves are arranged in an array.

5. The display panel according to claim 3, wherein the retaining wall comprises a first sub-retaining wall and a second sub-retaining wall spaced apart from each other, and the plurality of grooves comprise a plurality of first sub-grooves and a plurality of a second sub-grooves; and
the plurality of the first sub-grooves are spaced apart from each other and disposed on the first sub-retaining wall, and the plurality of the second sub-grooves are spaced apart from each other and disposed on the second sub-retaining wall.

6. The display panel according to claim 5, wherein each of the first sub-grooves corresponds to one of the second sub-grooves.

7. The display panel according to claim 5, wherein the plurality of the first sub-grooves and the plurality of the second sub-grooves are staggered alternately from each other; and
each of the second sub-grooves is correspondingly disposed at an interval between adjacent ones of the first sub-grooves.

8. The display panel according to claim 7, wherein a distance between the adjacent ones of the first sub-grooves is equal to a distance between adjacent ones of the second sub-grooves.

9. A display panel, comprising:
a substrate;
at least one retaining wall disposed on the substrate; and
an encapsulation film disposed on the retaining wall and covering the substrate;
wherein a plurality of grooves further disposed on a surface of the retaining wall facing the encapsulating film, and the encapsulating film extends into the plurality of grooves.

10. The display panel according to claim 9, wherein the encapsulating film comprises a first inorganic layer, an organic layer, and a second inorganic layer disposed on the substrate in sequence; and
wherein the retaining wall is disposed on an edge region of the first inorganic layer, the organic layer is disposed on the first inorganic layer and retained within the retaining wall, the second inorganic layer is disposed on the organic layer and covers the first inorganic layer, the organic layer, and the retaining wall, and the second inorganic layer extends into the grooves.

11. The display panel according to claim 10, wherein the plurality of grooves are correspondingly disposed on a bending region of the substrate.

12. The display panel according to claim 11, wherein the substrate comprises opposite first and second ends;
the retaining walls are disposed on the first end and the second end, and a direction of the first end to the second end is perpendicular to a bending direction of the substrate.

13. The display panel according to claim 12, wherein the plurality of the grooves are arranged in an array.

14. The display panel according to claim 12, wherein the retaining wall comprises a first sub-retaining wall and a second sub-retaining wall spaced apart from each other, and the plurality of grooves comprise a plurality of first sub-grooves and a plurality of a second sub-grooves; and
the plurality of the first sub-grooves are spaced apart from each other and disposed on the first sub-retaining wall, and the plurality of the second sub-grooves are spaced apart from each other and disposed on the second sub-retaining wall.

15. The display panel according to claim 14, wherein each of the first sub-grooves corresponds to one of the second sub-grooves.

16. The display panel according to claim 14, wherein the plurality of the first sub-grooves and the plurality of the second sub-grooves are staggered alternately from each other; and
 each of the second sub-grooves is correspondingly disposed at an interval between its adjacent ones of the first sub-grooves.

17. The display panel according to claim 16, wherein a distance between the adjacent ones of the first sub-grooves is equal to a distance between adjacent ones of the second sub-grooves.

18. The display panel according to claim 9, wherein each of the grooves is provided with a protrusion, and the protrusion has a height greater than a depth of the grooves.

19. A display device, comprising a display panel, the display panel comprising:
 a substrate;
 a retaining wall disposed on the substrate; and
 an encapsulation film disposed on the retaining wall and covering the substrate,
 wherein a plurality of grooves are further disposed on a surface of the retaining wall facing the encapsulating film, and the encapsulating film extends into the plurality of grooves.

* * * * *